US012713641B2

(12) United States Patent
Chen et al.

(10) Patent No.: US 12,713,641 B2
(45) Date of Patent: Aug. 18, 2026

(54) EMBEDDED HIGH-VOLTAGE SEMICONDUCTOR DEVICE AND FABRICATION METHOD THEREOF

(71) Applicant: UNITED MICROELECTRONICS CORP., Hsin-Chu City (TW)

(72) Inventors: Chang-Yih Chen, Tainan City (TW); Kuo-Hsing Lee, Hsinchu County (TW); Hung-Chan Lin, Tainan City (TW); Chun-Hsien Lin, Tainan City (TW); Chih-Chin Tsai, Tainan City (TW); Yi-Hsiu Chen, Pingtung County (TW); Hsin-Hsien Chen, New Taipei City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 363 days.

(21) Appl. No.: 18/631,088

(22) Filed: Apr. 10, 2024

(65) Prior Publication Data

US 2025/0280563 A1 Sep. 4, 2025

(30) Foreign Application Priority Data

Mar. 4, 2024 (TW) ................................ 113107636

(51) Int. Cl.

| | |
|---|---|
| ***H01L 29/78*** | (2006.01) |
| ***H10D 30/01*** | (2025.01) |
| ***H10D 30/62*** | (2025.01) |
| ***H10W 10/00*** | (2026.01) |
| ***H10W 10/17*** | (2026.01) |
| ***H10W 20/00*** | (2026.01) |

(52) U.S. Cl.

CPC ....... *H10D 30/6215* (2025.01); *H10D 30/024* (2025.01); *H10W 10/014* (2026.01); *H10W 10/17* (2026.01); *H10W 20/071* (2026.01)

(58) Field of Classification Search

CPC ............. H10D 30/024; H10D 30/6215; H10D 84/0158; H10W 10/014; H10W 10/17; H10W 20/071

See application file for complete search history.

(56) References Cited

U.S. PATENT DOCUMENTS

| | | | | |
|---|---|---|---|---|
| 11,688,783 B1* | 6/2023 | Hsiao | H10B 12/053 | 257/330 |
| 2013/0062728 A1* | 3/2013 | Kurz | H10B 20/25 | 257/E29.325 |
| 2023/0178614 A1* | 6/2023 | Hsiao | H10B 12/053 | 257/330 |

OTHER PUBLICATIONS

Yang, the specification, including the claims, and drawings in the U.S. Appl. No. 18/516,868, Filing Date: Nov. 21, 2023.

* cited by examiner

*Primary Examiner* — Jaehwan Oh

(74) *Attorney, Agent, or Firm* — Winston Hsu

(57) ABSTRACT

An embedded high-voltage semiconductor device includes a substrate with a low-voltage device region and a high-voltage device region; an ILD layer located on the substrate; a first interconnection metal layer located on the ILD layer in the low-voltage device region a; a first IMD layer between the ILD layer and the first interconnection metal layer; a second interconnection metal layer located on the ILD layer in the high-voltage device region; and a second IMD layer between the ILD layer and the second interconnection metal layer. The second IMD layer is denser than the first IMD layer.

20 Claims, 18 Drawing Sheets

EMBEDDED HIGH-VOLTAGE SEMICONDUCTOR DEVICE AND FABRICATION METHOD THEREOF

BACKGROUND OF THE INVENTION

1. Field of the Invention

The invention relates to the field of semiconductor technology, particularly to an embedded high-voltage (eHV) semiconductor device and its manufacturing method.

2. Description of the Prior Art

To reduce the RC delay, there has been a desire to replace the dielectrics in metal interconnect structures with materials having lower dielectric constants. Such materials are referred to as low-k and ultra-low-k dielectrics. A low-k dielectric is a material having a smaller dielectric constant than $SiO_2$. $SiO_2$ has a dielectric constant of about 4.0. An ultra-low-k dielectric is a material having a dielectric constant of about 2.1 or less.

Due to the reduction in the thickness of the low-k or ultra-low-k inter-metal dielectric layer between the M1 metal and the M0 metal, the medium-voltage or high-voltage area of the embedded high-voltage device (eHV device) may fail to pass 8V TDDB (Time-Dependent Dielectric Breakdown) reliability test. Therefore, this technical field still needs an improved embedded high-voltage semiconductor device and its manufacturing method to solve the problem of inter-metal dielectric layer breakdown.

SUMMARY OF THE INVENTION

It is one object of the present invention to provide an improved embedded high-voltage semiconductor device and its manufacturing method to solve the shortcomings or deficiencies of the existing technology.

One aspect of the invention provides an embedded high-voltage (eHV) semiconductor device including a substrate having a low-voltage device region and a high-voltage device region thereon; an inter-layer dielectric (ILD) layer on the substrate; a first trench isolation region in the substrate within the low-voltage device region; a first gate in the ILD layer and on the first trench isolation region; a first gate contact in the ILD layer and on the first gate; a first interconnection metal layer overlying the first gate contact; a first inter-metal dielectric (IMD) layer on the ILD layer and between the first interconnection metal layer and the first gate contact; a second trench isolation region in the substrate within the high-voltage device region; a second gate in the ILD layer and on the second trench isolation region; a second gate contact in the ILD layer and on the second gate; a second interconnection metal layer overlying the second gate contact; and a second inter-metal dielectric (IMD) layer on the ILD layer and between the second interconnection metal layer and the second gate contact. The second IMD layer is denser than the first IMD layer.

According to some embodiments, the second interconnection metal layer overlaps the second gate contact.

According to some embodiments, the first IMD layer comprises an ultra-low dielectric constant material layer.

According to some embodiments, the second IMD layer comprises a TEOS-based oxide layer or a high-density plasma (HDP) oxide layer.

According to some embodiments, the second interconnection metal layer is disposed in the second IMD layer.

According to some embodiments, the first IMD layer extends onto a top surface of the second IMD layer.

According to some embodiments, the second interconnection metal layer is disposed in the first IMD layer that extends onto the top surface of the second IMD layer.

According to some embodiments, the first gate contact and the second gate contact comprise tungsten.

According to some embodiments, the first gate and the second gate are metal gates.

According to some embodiments, the first IMD layer and the second IMD layer are ultra-low dielectric constant material layer.

Another aspect of the invention provides a method for forming an embedded high-voltage (eHV) semiconductor device. A substrate having a low-voltage device region and a high-voltage device region thereon is provided. An inter-layer dielectric (ILD) layer is formed on the substrate. A first trench isolation region is formed in the substrate within the low-voltage device region. A first gate is disposed in the ILD layer and on the first trench isolation region. A first gate contact is formed in the ILD layer and on the first gate. A first interconnection metal layer is formed on the first gate contact. A first inter-metal dielectric (IMD) layer is formed on the ILD layer and between the first interconnection metal layer and the first gate contact. A second trench isolation region is formed in the substrate within the high-voltage device region. A second gate is formed in the ILD layer and on the second trench isolation region. A second gate contact is formed in the ILD layer and on the second gate. A second interconnection metal layer is formed on the second gate contact. A second inter-metal dielectric (IMD) layer is formed on the ILD layer and between the second interconnection metal layer and the second gate contact. The second IMD layer is denser than the first IMD layer.

According to some embodiments, the second interconnection metal layer overlaps the second gate contact.

According to some embodiments, the first IMD layer comprises an ultra-low dielectric constant material layer.

According to some embodiments, the second IMD layer comprises a TEOS-based oxide layer or a high-density plasma (HDP) oxide layer.

According to some embodiments, the second interconnection metal layer is disposed in the second IMD layer.

According to some embodiments, the first IMD layer extends onto a top surface of the second IMD layer.

According to some embodiments, the second interconnection metal layer is disposed in the first IMD layer that extends onto the top surface of the second IMD layer.

According to some embodiments, the first gate contact and the second gate contact comprise tungsten.

According to some embodiments, the first gate and the second gate are metal gates.

According to some embodiments, the first IMD layer and the second IMD layer are ultra-low dielectric constant material layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Please refer to FIGS. 1 to 7, which illustrate a method of forming an embedded high-voltage (eHV) semiconductor device 1 according to an embodiment of the present invention. For example, the eHV semiconductor device 1 of the present invention can be applied to a display driver integrated circuit (DDIC) using fin field effect transistor (FinFET) processes at 17 nm node or beyond.

Figure 1:
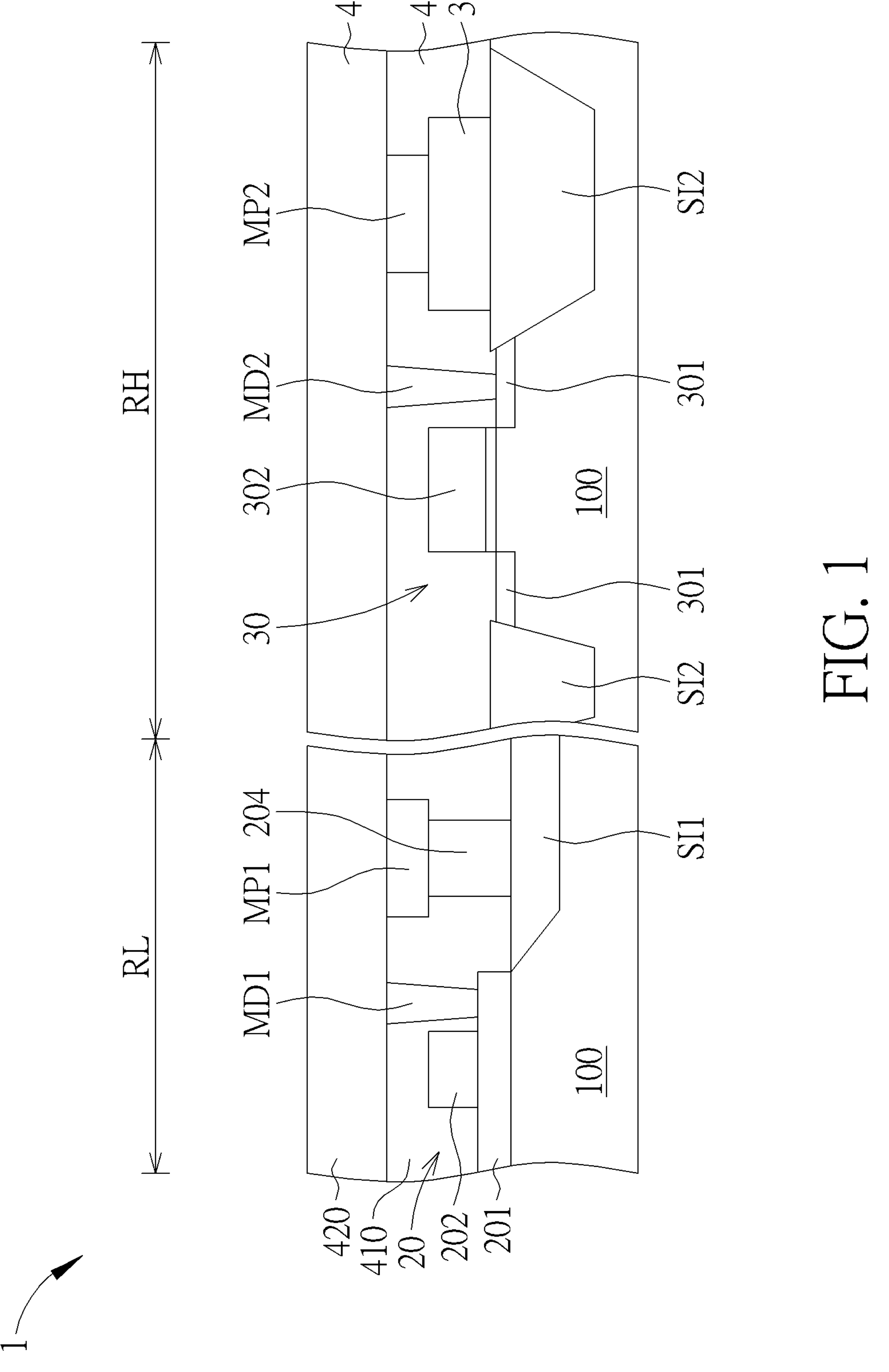
FIGS. 1-7 illustrate a method of forming an embedded high-voltage (eHV) semiconductor device according to an embodiment of the present invention.

As shown in FIG. 1, a substrate 100 is first provided, for example, a silicon substrate, but is not limited thereto. According to an embodiment of the present invention, the substrate 100 has a low-voltage device region RL and a high-voltage device region RH. A trench isolation region SI1 and a trench isolation region SI2 are respectively formed in the substrate 100 in the low-voltage device region RL and the high-voltage device region RH. The trench isolation region SI1 and the trench isolation region SI2 can be formed using a shallow trench isolation (STI) process.

According to an embodiment of the present invention, in the low-voltage device region RL, a circuit element 20 is formed on the substrate 100 adjacent to the trench isolation region SI1. In the high-voltage device region RH, a circuit element 30 is formed on the substrate 100 adjacent to the trench isolation region SI2. According to an embodiment of the present invention, for example, the circuit element 20 may be a fin field effect transistor (FinFET) device, but is not limited thereto. According to an embodiment of the present invention, the operating voltage of the circuit element 20 may be less than 5V, for example, 1.8V. The circuit element 20 may include a fin structure 201 and a metal gate 202 extending across the fin structure 201. According to an embodiment of the present invention, for example, the circuit element 30 may be a high-voltage transistor element with operating voltages greater than 5V. For example, the circuit element 20 may be a planar field effect transistor including a drain or source doped region 301 and a gate 302.

According to an embodiment of the present invention, a gate 204 and a gate 304 are formed on the trench isolation region SI1 and the trench isolation region SI2 respectively. According to an embodiment of the present invention, for example, the gate 204 and the gate 304 may be metal gates, but are not limited thereto.

Subsequently, a chemical vapor deposition (CVD) process may be performed to deposit an interlayer dielectric (ILD) layer 410 on the substrate 100 in a blanket manner. A metallization process is then performed to form a diffusion contact MD1 and a gate contact MP1 in the ILD layer 410 in the low-voltage device region RL, and a diffusion contact MD2 and a gate contact MP2 in the ILD layer 410 in the high-voltage device region RH. According to an embodiment of the present invention, the diffusion contact MD1 directly contacts the doped region on the fin structure 201, the gate contact MP1 directly contacts the gate 204, the diffusion contact MD2 directly contacts the drain or source doped region 301, and the gate contact MP2 directly contacts the gate 304. According to an embodiment of the present invention, the gate 204 and the gate contact MP1 are located directly above the trench isolation region SI1, and the gate 304 and the gate contact MP2 are located directly above the trench isolation region SI2. According to an embodiment of the present invention, the gate contact MP1 and the gate contact MP2 may contain tungsten, but are not limited thereto.

A chemical vapor deposition process is then performed to deposit an inter-metal dielectric (IMD) layer 420 on the substrate 100 in a blanket manner. According to an embodiment of the present invention, for example, the IMD layer 420 may include a structurally denser dielectric layer such as a TEOS oxide layer or a high-density plasma (HDP) oxide layer.

Figure 2:
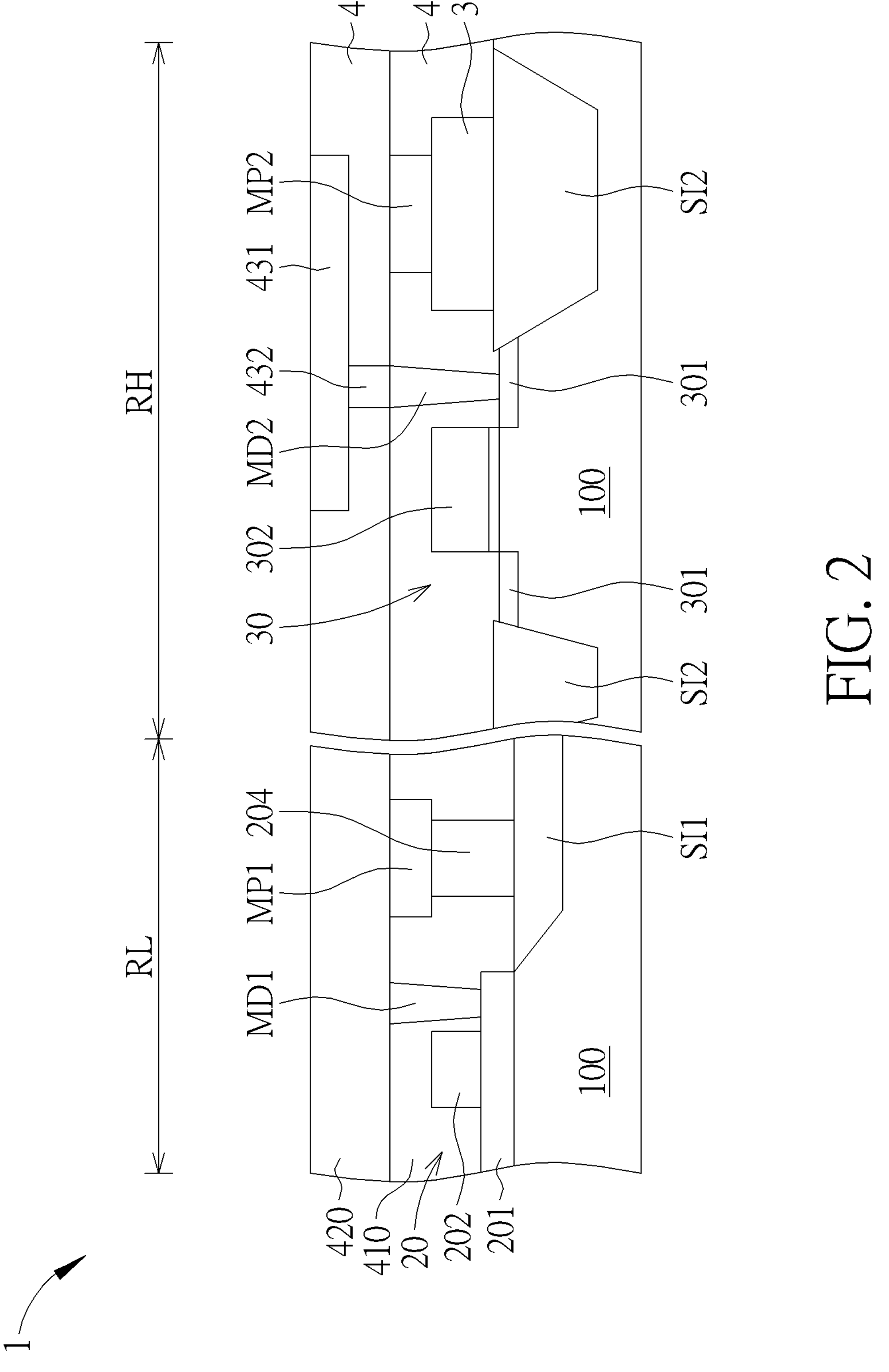

As shown in FIG. 2, subsequently, a metallization process, such as a damascene copper process, is performed to form an interconnection metal layer 431 and a via 432 in the IMD layer 420 in the high-voltage device region RH. The via 432 electrically connects the interconnection metal layer 431 to the underlying diffusion contact MD2. According to an embodiment of the present invention, the interconnection metal layer 431 extends laterally into the region directly above the gate 304 and the gate contact MP2. Therefore, when viewed from above, the interconnection metal layer 431 overlaps the gate contact MP2. Between the interconnection metal layer 431 and gate contact MP2 is the IMD layer 420.

Figure 3:
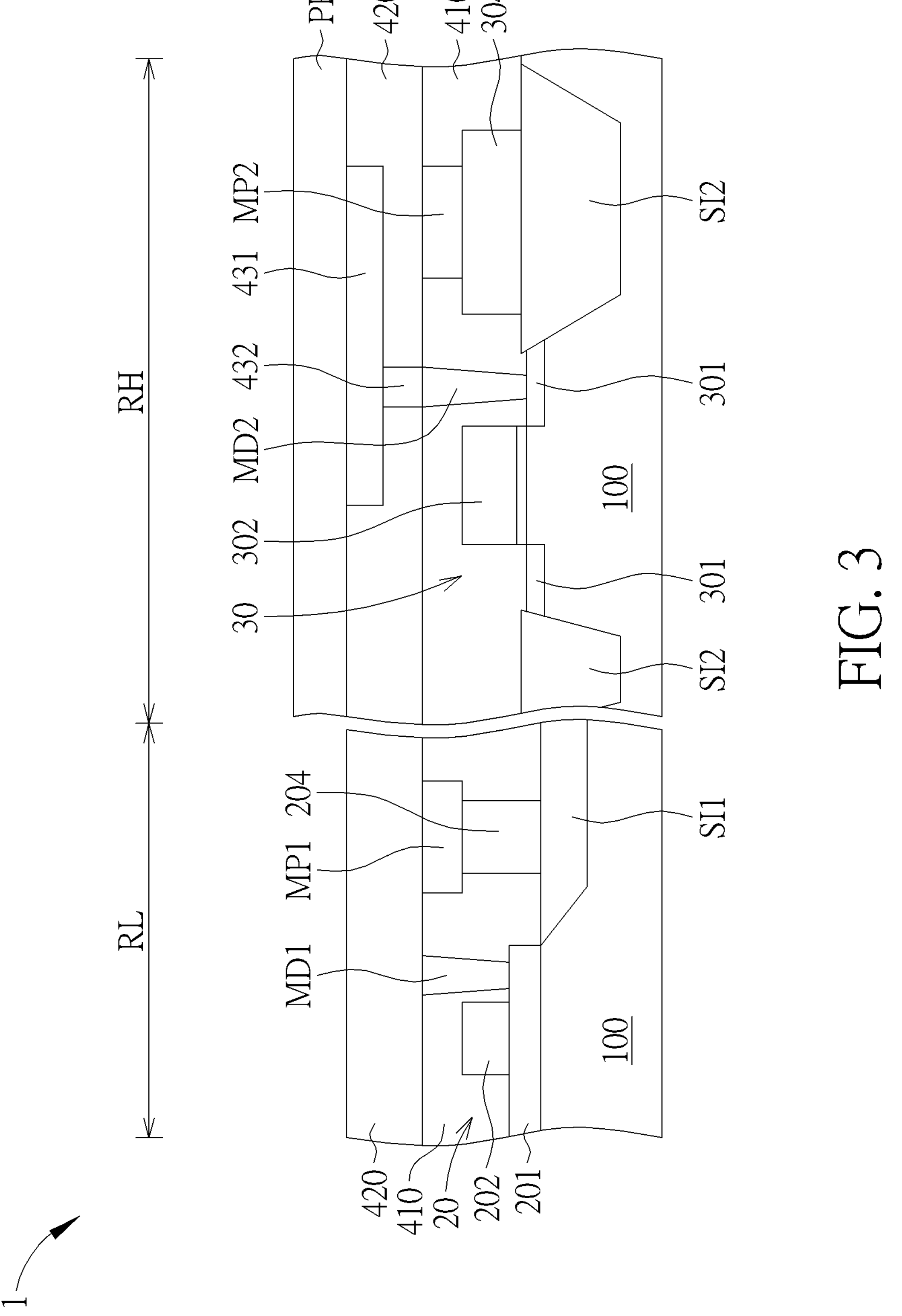

As shown in FIG. 3, a photolithography process is then performed to form a photoresist pattern PR on the high-voltage device region RH. At this point, the photoresist pattern PR covers the high-voltage device region RH, while exposes the IMD layer 420 of the low-voltage device region RL.

Figure 4:
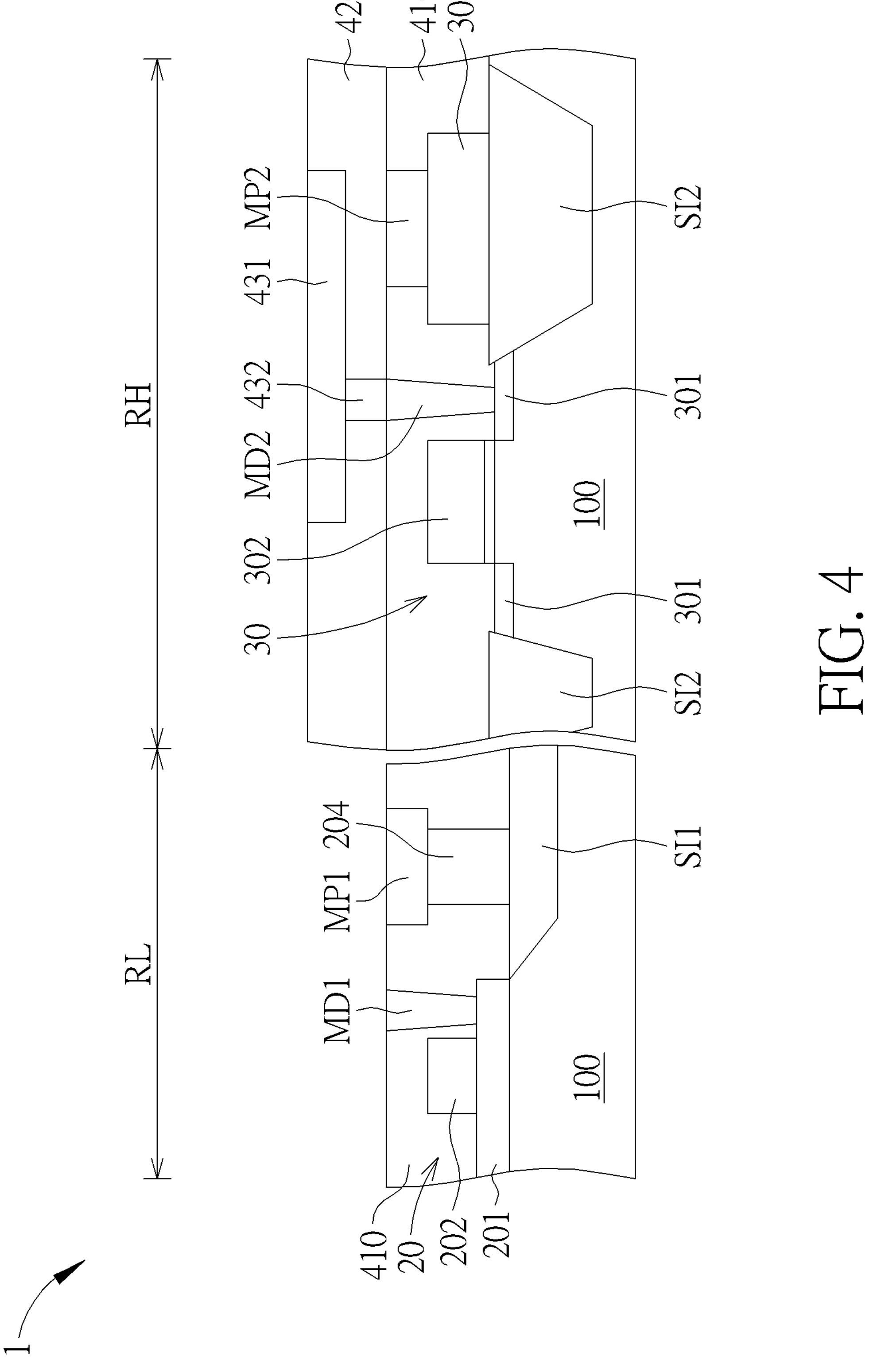

As shown in FIG. 4, an etching process, for example, an anisotropic dry etching process is then performed, using the photoresist pattern PR as an etching mask to remove the IMD layer 420 in the low-voltage device region RL that is not covered by the photoresist pattern PR, thereby exposing the ILD layer 410, the diffusion contact MD1 and the gate contact MP1 in the low-voltage device region RL.

Figure 5:
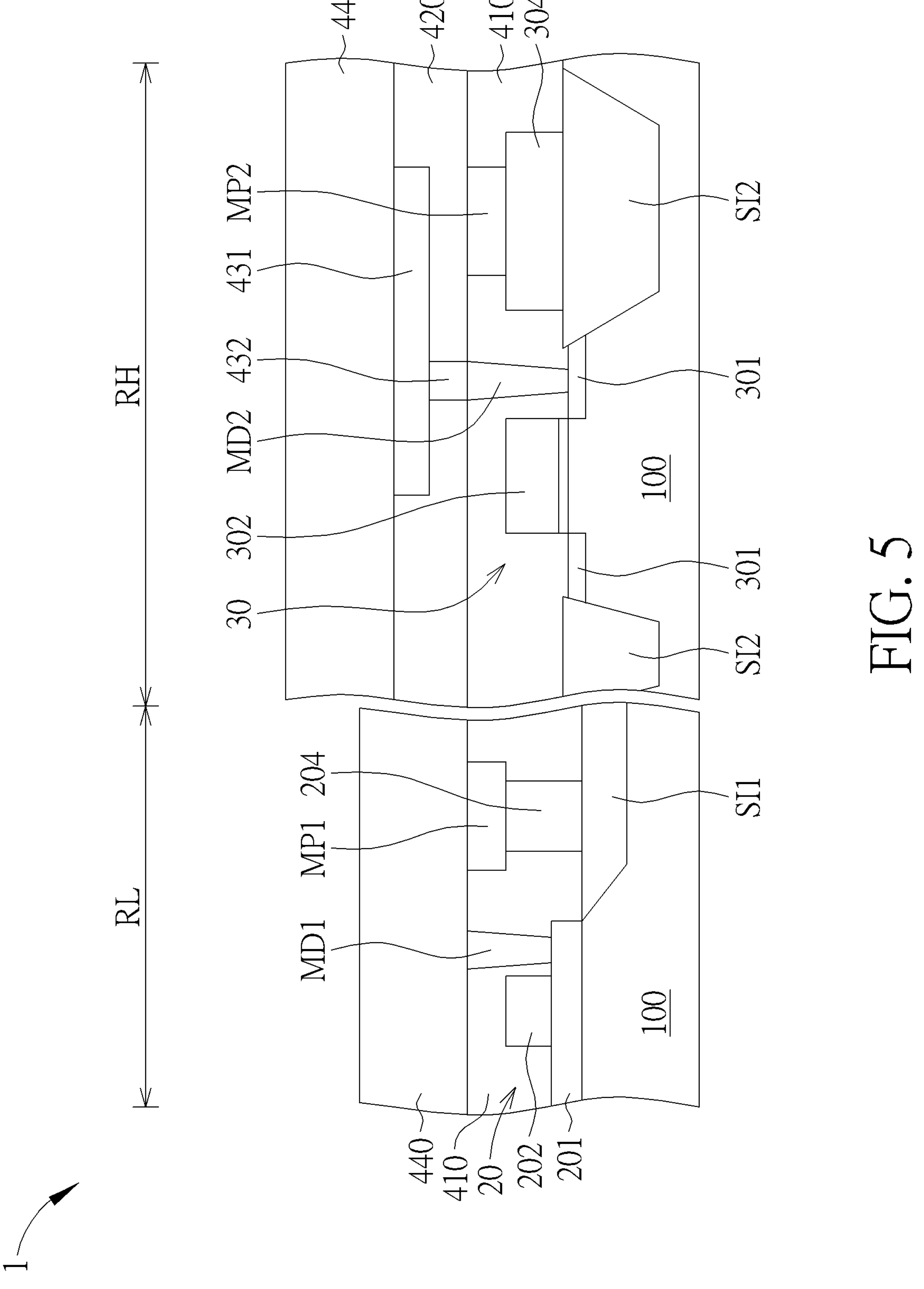

As shown in FIG. 5, a chemical vapor deposition process is then performed to deposit an inter-metal dielectric (IMD) layer 440 on the substrate 100 in a blanket manner. According to an embodiment of the present invention, for example, the IMD layer 440 may include low dielectric constant (low k) and ultra-low dielectric constant (ultra-low k) dielectric materials. For example, the IMD layer 440 may include porous silicon dioxide, porous carbon-doped silicon dioxide, porous SiLK, porous SiCOH layers, or the like. According to an embodiment of the present invention, the IMD layer 420 is denser than the IMD layer 440.

Figure 6:
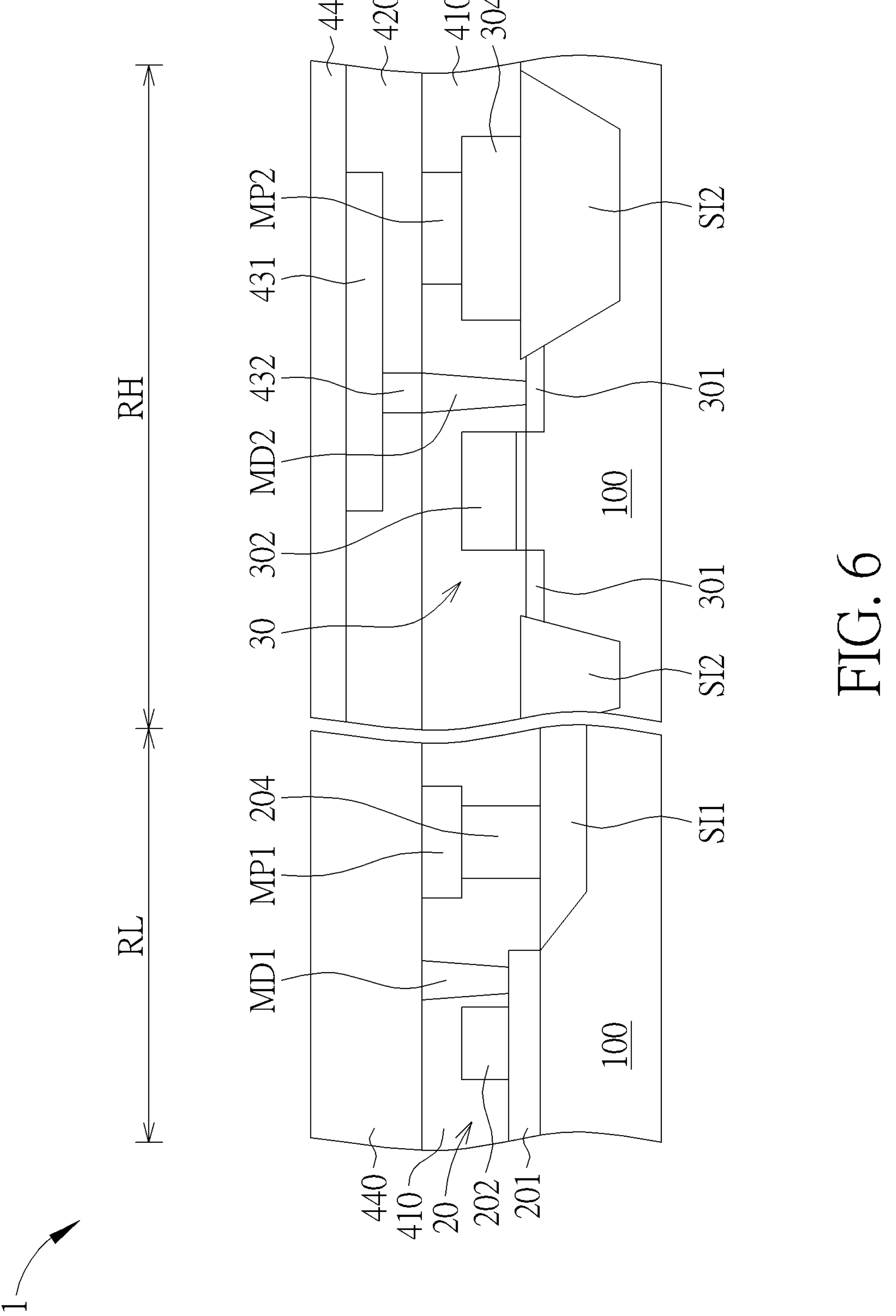

As shown in FIG. 6, a chemical mechanical polishing (CMP) process is then performed to polish the surface of the IMD layer 440 so that the surface of the IMD layer 440 in the low-voltage device region RL is coplanar with the surface of the IMD layer 440 in the high-voltage device region RH.

Figure 7:
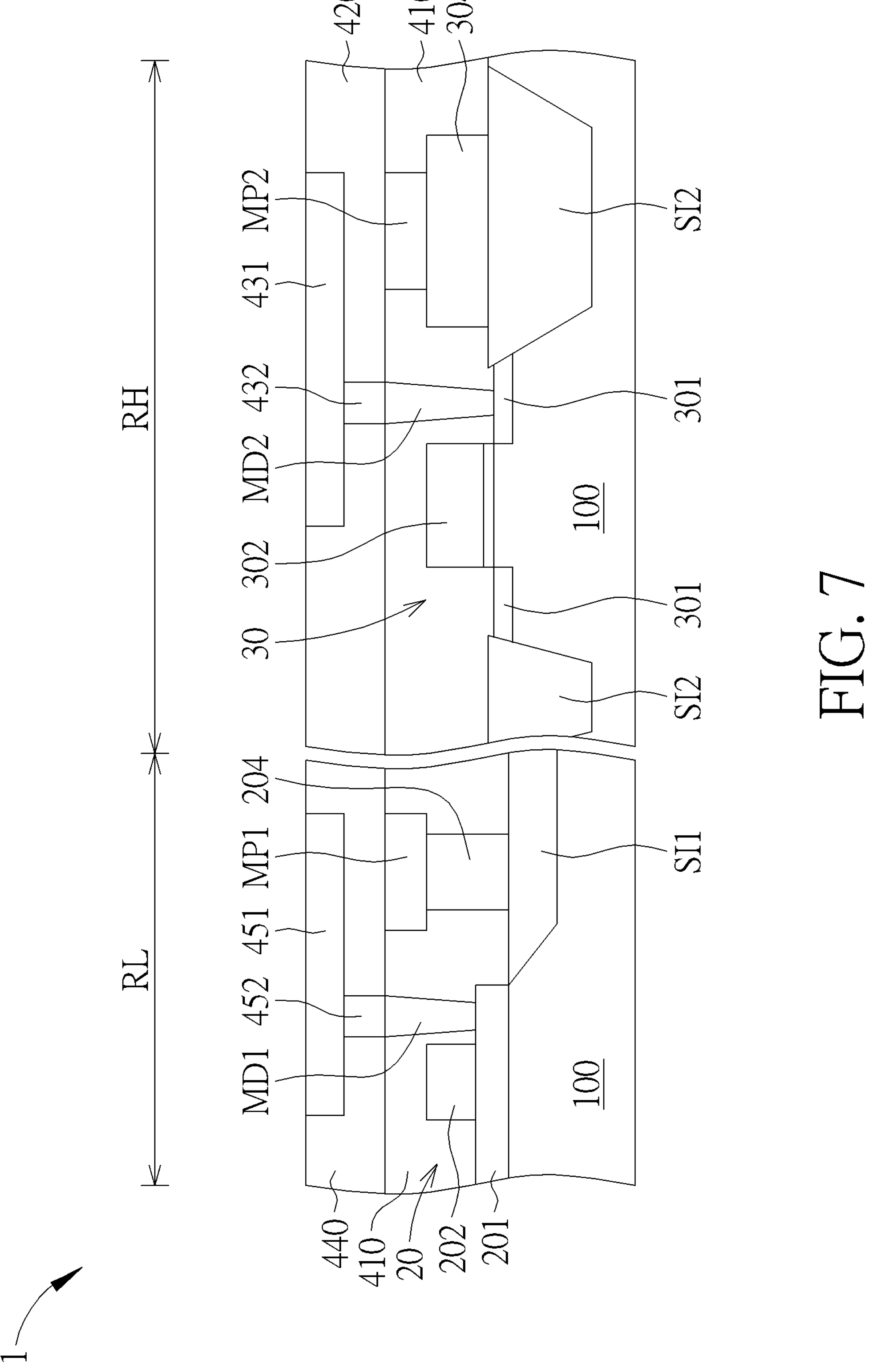

As shown in FIG. 7, a metallization process, such as a damascene copper process, is then performed to form an interconnection metal layer 451 and a via 452 in the IMD layer 440 in the low-voltage device region RL. The via 452 electrically connect the metal layer 451 to the underlying diffusion contact MD1. According to an embodiment of the present invention, the interconnection metal layer 451 extends laterally to the region directly above the gate 204 and the gate contact MP1, so when viewed from above, the interconnection metal layer 451 overlaps the gate contact MP1. Between the interconnection metal layer 451 and the gate contact MP1 is the IMD layer 440. A CMP process can be continued to expose the interconnection metal layer 431 and the interconnection metal layer 451, and then the subsequent metal interconnection process can be performed.

Please refer to FIGS. 8 to 14, which illustrate a method of forming an eHV semiconductor device 2 according to another embodiment of the present invention, wherein like regions, layers or elements are designated by like numeral numbers or labels. For example, the eHV semiconductor device 2 of the present invention can be applied to a display driver integrated circuit (DDIC) using a FinFET process at 17 nm node or beyond.

Figure 8:
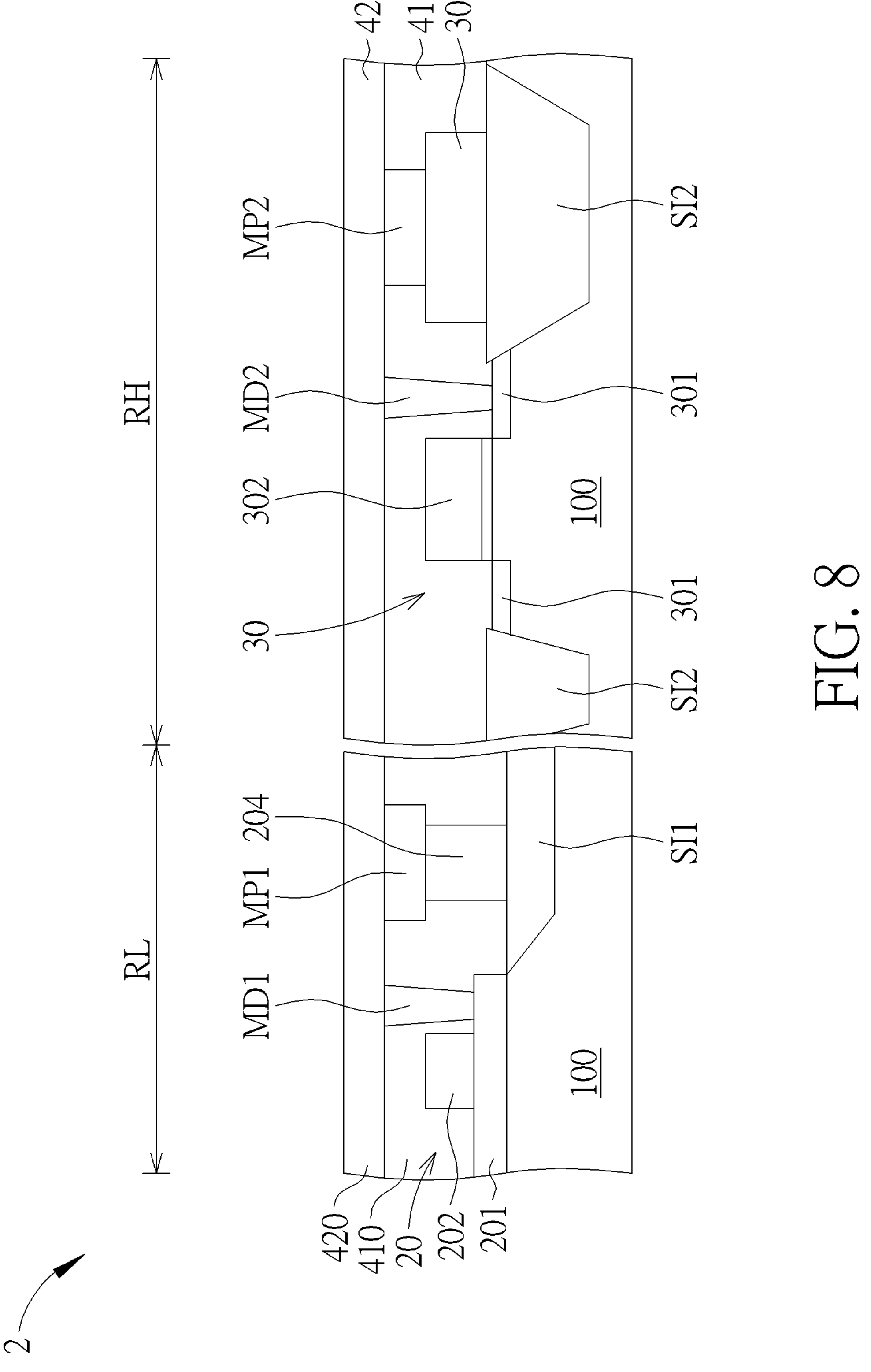
FIGS. 8-14 illustrate a method of forming an eHV semiconductor device according to another embodiment of the present invention.

As shown in FIG. 8, a substrate 100 is first provided, for example, a silicon substrate, but is not limited thereto. According to an embodiment of the present invention, the substrate 100 has a low-voltage device region RL and a high-voltage device region RH. A trench isolation region SI1 and a trench isolation region SI2 are respectively formed in the substrate 100 in the low-voltage device region RL and the high-voltage device region RH. The trench isolation region SI1 and the trench isolation region SI2 can be formed using a shallow trench insulation (STI) process.

According to an embodiment of the present invention, in the low-voltage device region RL, a circuit element 20 is formed on the substrate 100 adjacent to the trench isolation region SI1. In the high-voltage device region RH, a circuit element 30 is formed on the substrate 100 adjacent to the trench isolation region SI2. According to an embodiment of the present invention, for example, the circuit element 20 may be a FinFET device, but is not limited thereto. According to an embodiment of the present invention, the operating voltage of the circuit element 20 may be less than 5V, for example, 1.8V. The circuit element 20 may include a fin structure 201 and a metal gate 202 extending across the fin structure 201. According to an embodiment of the present invention, for example, the circuit element 30 may be a high-voltage transistor device with operating voltages greater than 5V. For example, the circuit element 20 may be a planar field effect transistor including a drain or source doped region 301 and a gate 302.

According to an embodiment of the present invention, a gate 204 and a gate 304 are formed on the trench isolation region SI1 and the trench isolation region SI2, respectively. According to an embodiment of the present invention, for example, the gate 204 and the gate 304 may be metal gates, but are not limited thereto.

Subsequently, a chemical vapor deposition process may be performed to deposit an interlayer dielectric (ILD) layer 410 on the substrate 100 in a blanket manner. A metallization process is then performed to form a diffusion contact MD1 and a gate contact MP1 in the ILD layer 410 in the low-voltage device region RL, and a diffusion contact MD2 and a gate contact MP2 in the ILD layer in the high-voltage device region RH. According to an embodiment of the present invention, the diffusion contact MD1 directly contacts the doped region on the fin structure 201, the gate contact MP1 directly contacts the gate 204, the diffusion contact MD2 directly contacts the drain or source doped region 301, and the gate contact MP2 directly contacts gate 304. According to an embodiment of the present invention, the gate 204 and the gate contact MP1 are located directly above the trench isolation region SI1, and the gate 304 and the gate contact MP2 are located directly above the trench isolation region SI2. According to an embodiment of the present invention, the gate contact MP1 and the gate contact MP2 may contain tungsten, but are not limited thereto.

A chemical vapor deposition process is then performed to deposit an inter-metal dielectric (IMD) layer 420 on the substrate 100 in a blanket manner. According to an embodiment of the present invention, for example, the IMD layer 420 may include a structurally denser dielectric layer such as a TEOS oxide layer or a high-density plasma (HDP) oxide layer.

Figure 9:
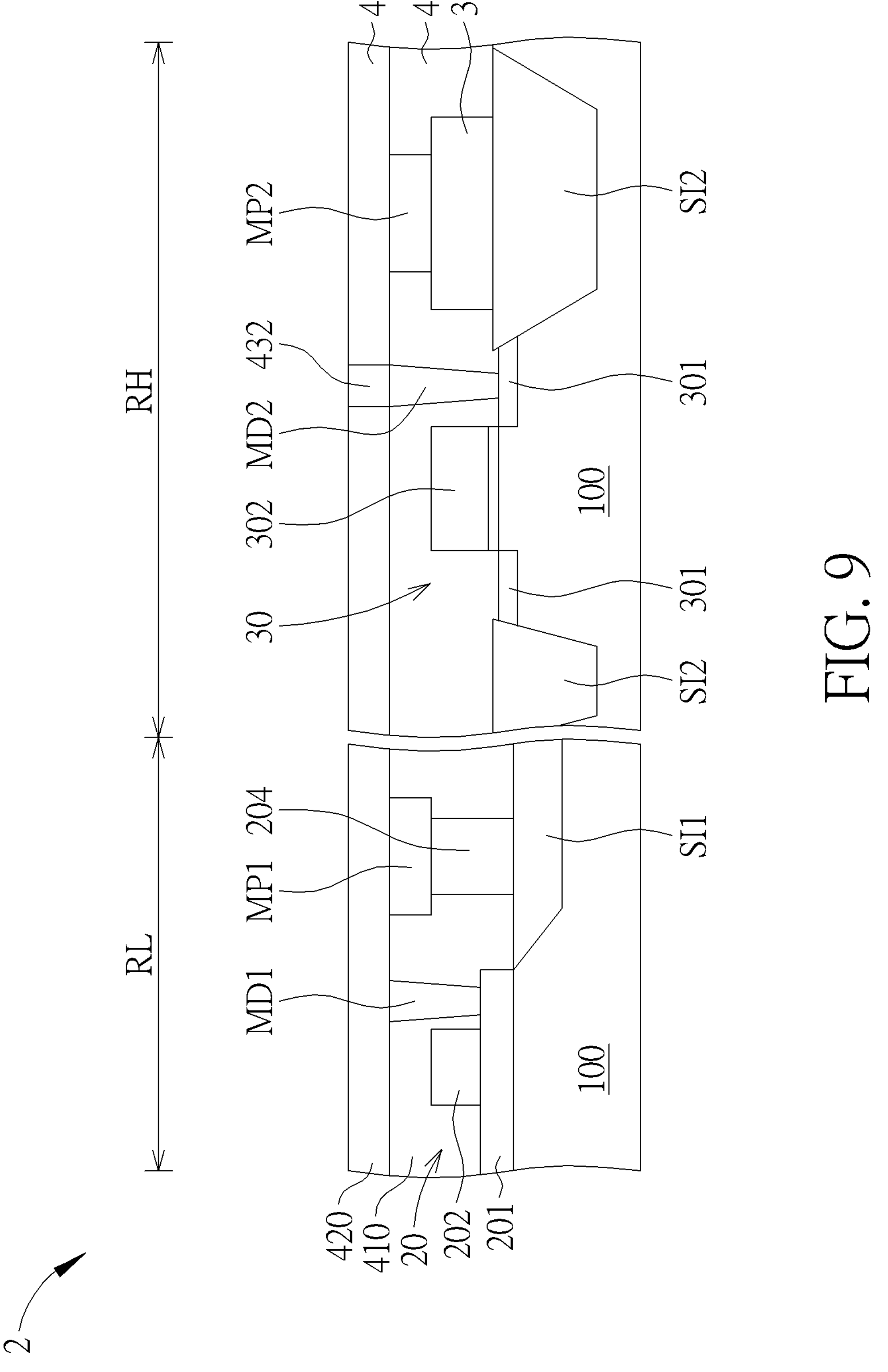

As shown in FIG. 9, a metallization process, such as a damascene copper process, is then performed to form a via 432 in the IMD layer 420 in the high-voltage device region RH. The via 432 is electrically connected with the underlying diffusion contact MD2.

Figure 10:
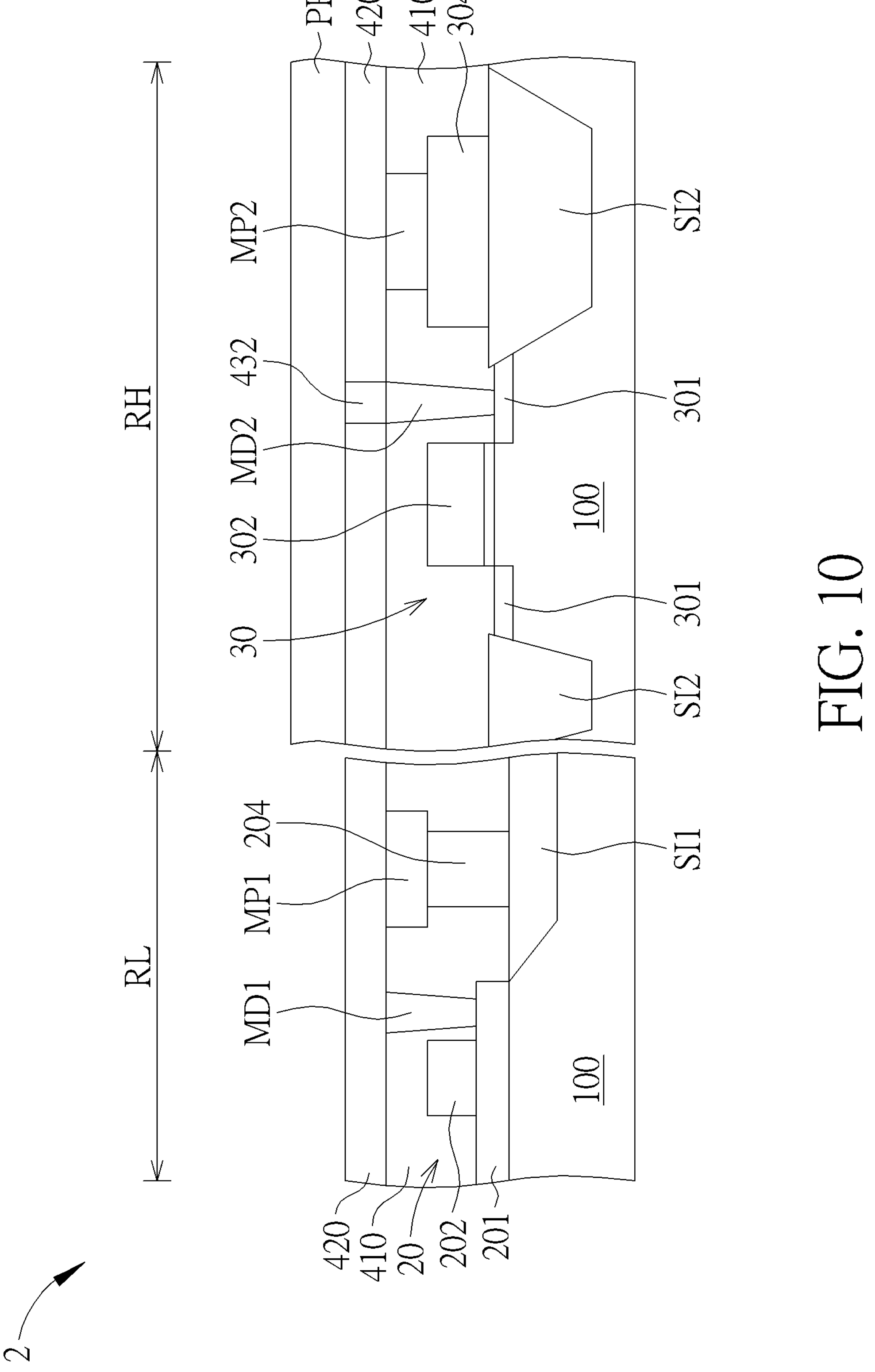

As shown in FIG. 10, a photolithography process is then performed to form a photoresist pattern PR on the high-voltage device region RH. The photoresist pattern PR covers the high-voltage device region RH, while exposes the IMD layer 420 in the low-voltage device region RL.

Figure 11:
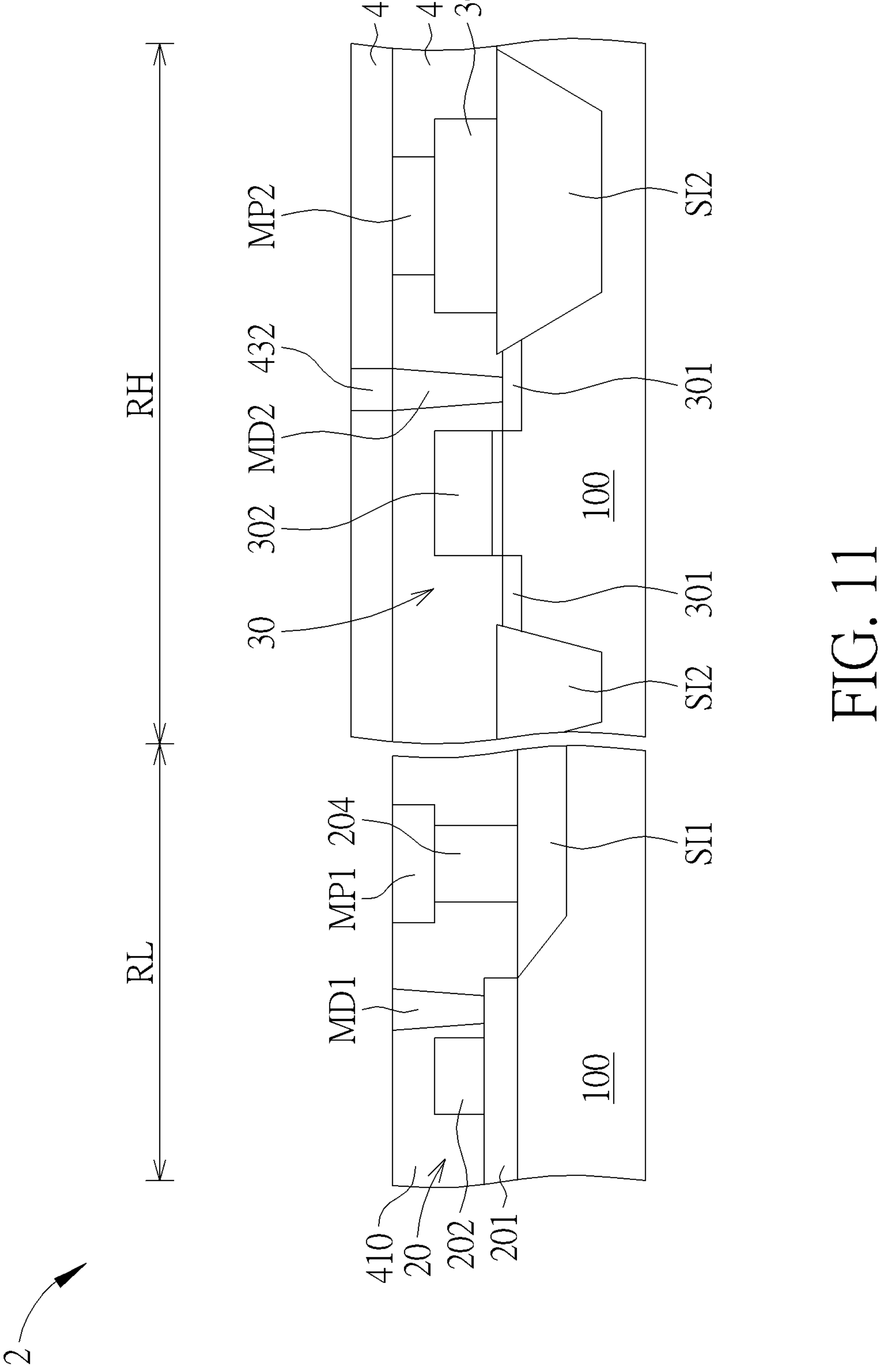

As shown in FIG. 11, an etching process, for example, an anisotropic dry etching process is then performed, using the photoresist pattern PR as an etching mask to remove the IMD layer 420 in the low-voltage device region RL that is not covered by the photoresist pattern PR, thereby exposing the ILD layer 410, the diffusion contact MD1 and the gate contact MP1 in the low-voltage device region RL.

Figure 12:
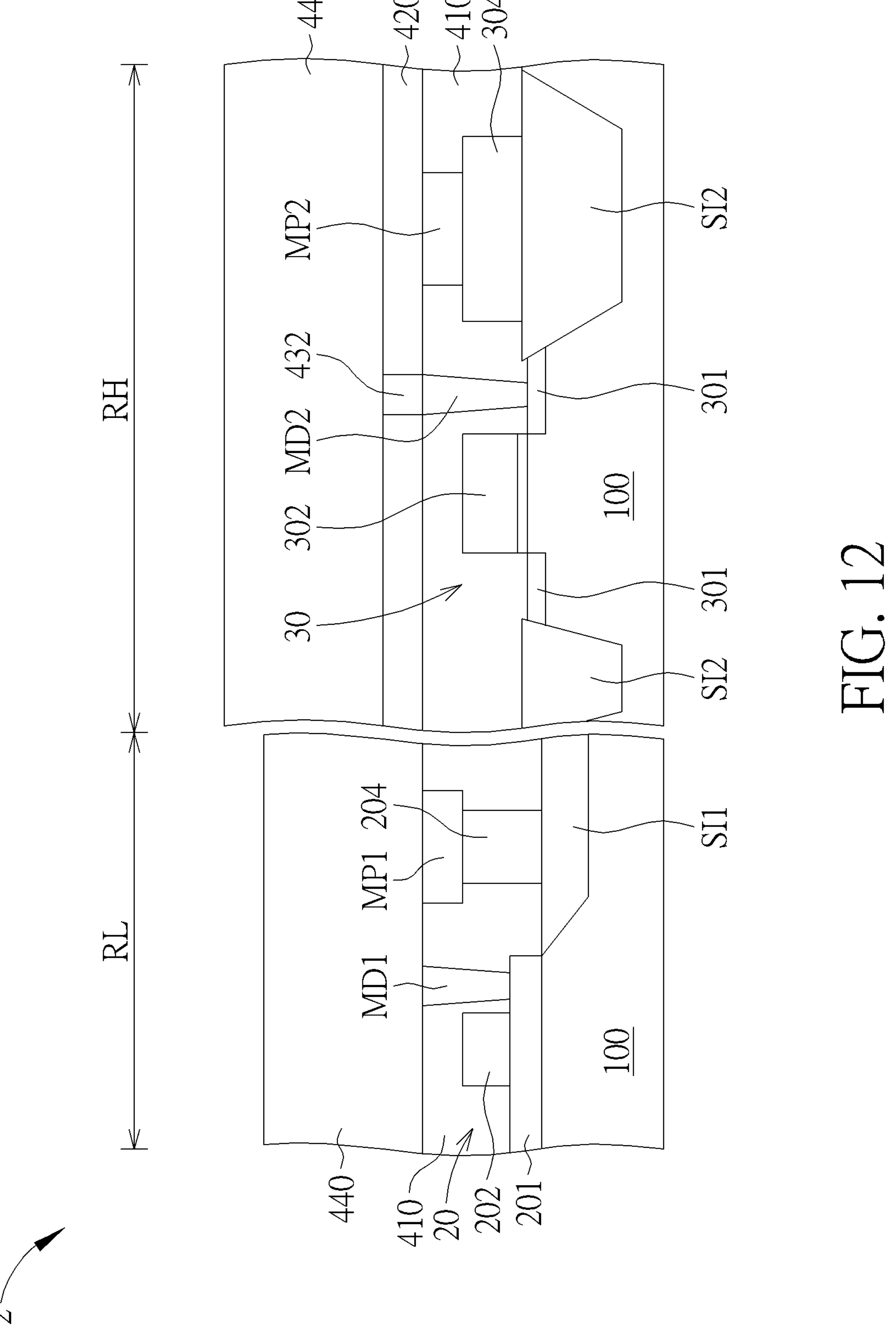

As shown in FIG. 12, a chemical vapor deposition process is then performed to deposit an inter-metal dielectric (IMD) layer 440 on the substrate 100 in a blanket manner. According to an embodiment of the present invention, for example, the IMD layer 440 may include low-k and ultra-low-k dielectric materials. For example, IMD layer 440 may include porous silicon dioxide, porous carbon-doped silicon dioxide, porous SiLK, porous SiCOH layers, or the like. According to an embodiment of the present invention, the IMD layer 420 is denser than the IMD layer 440.

Figure 13:
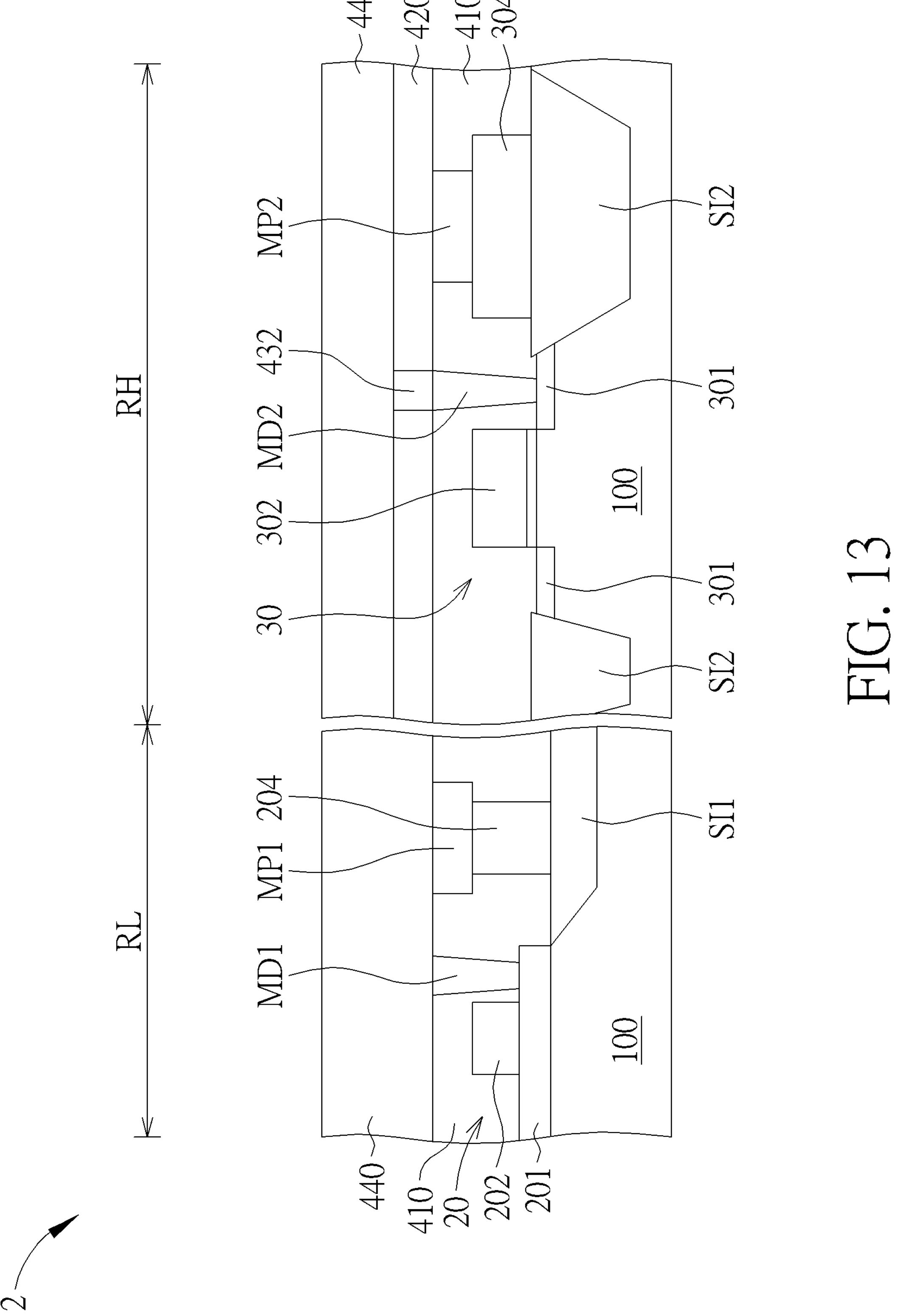

As shown in FIG. 13, a chemical mechanical polishing (CMP) process is then performed to polish the surface of the IMD layer 440 so that the surface of the IMD layer 440 in the low-voltage device region RL is coplanar with the surface of the IMD layer 440 in the high-voltage device region RH. According to an embodiment of the present invention, in the high-voltage device region RH, the IMD layer 440 extends to the top surface of the IMD layer 420.

Figure 14:
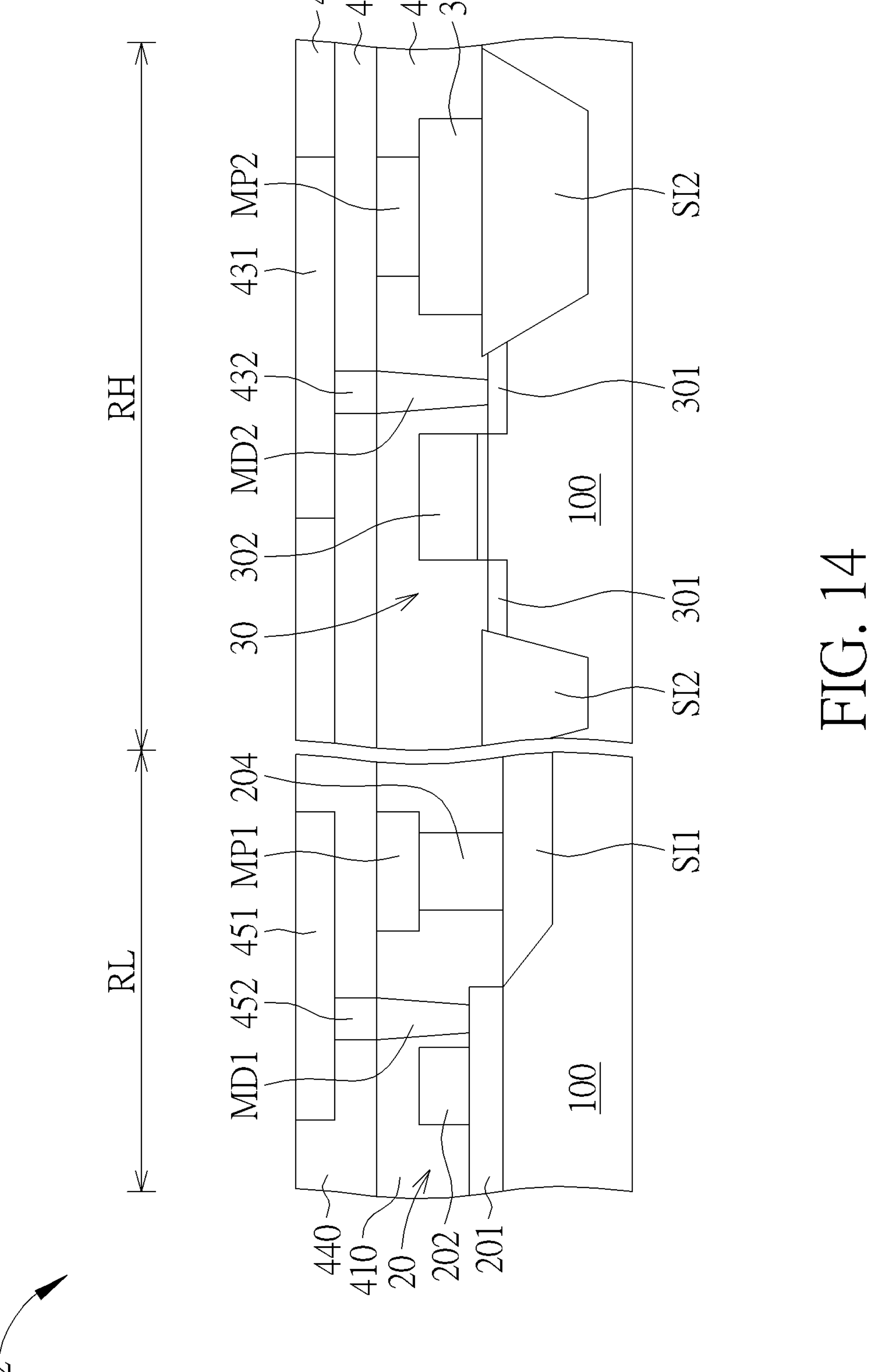

As shown in FIG. 14, a metallization process, such as a damascene copper process, is performed to form an interconnection metal layer 431 in the IMD layer 440 in the high-voltage device region RH, and an interconnection metal layer 431 in the IMD layer 440 in the low-voltage device region RL. The interconnection metal layer 431 is electrically connected to the via 432, and the via 452 electrically connects the interconnection metal layer 451 to the underlying diffusion contact MD1. According to an embodiment of the present invention, an interconnection metal layer 431 is disposed in the IMD layer 440 that extends to the top surface of the IMD layer 420.

According to an embodiment of the present invention, the interconnection metal layer 431 extends laterally to the region directly above the gate 304 and the gate contact MP2.

When viewed from above, the interconnection metal layer 431 overlaps the gate contact MP2. Between the interconnection metal layer 431 and the gate contact MP2 is the IMD layer 420. According to an embodiment of the present invention, the interconnection metal layer 451 extends laterally to the region directly above the gate 204 and the gate contact MP1. When viewed from above, the interconnection metal layer 451 overlaps the gate contact MP1. Between the interconnection metal layer 451 and the gate contact MP1 is the IMD layer 440.

Please refer to FIGS. 15 to 18, which illustrate a method of forming an eHV semiconductor device 3 according to still another embodiment of the present invention, wherein like regions, layers or elements are designated by like numeral numbers or labels. For example, the eHV semiconductor device 3 of the present invention can be applied to a display driver integrated circuit (DDIC) using a FinFET process at 17 nm node or beyond.

Figure 15:
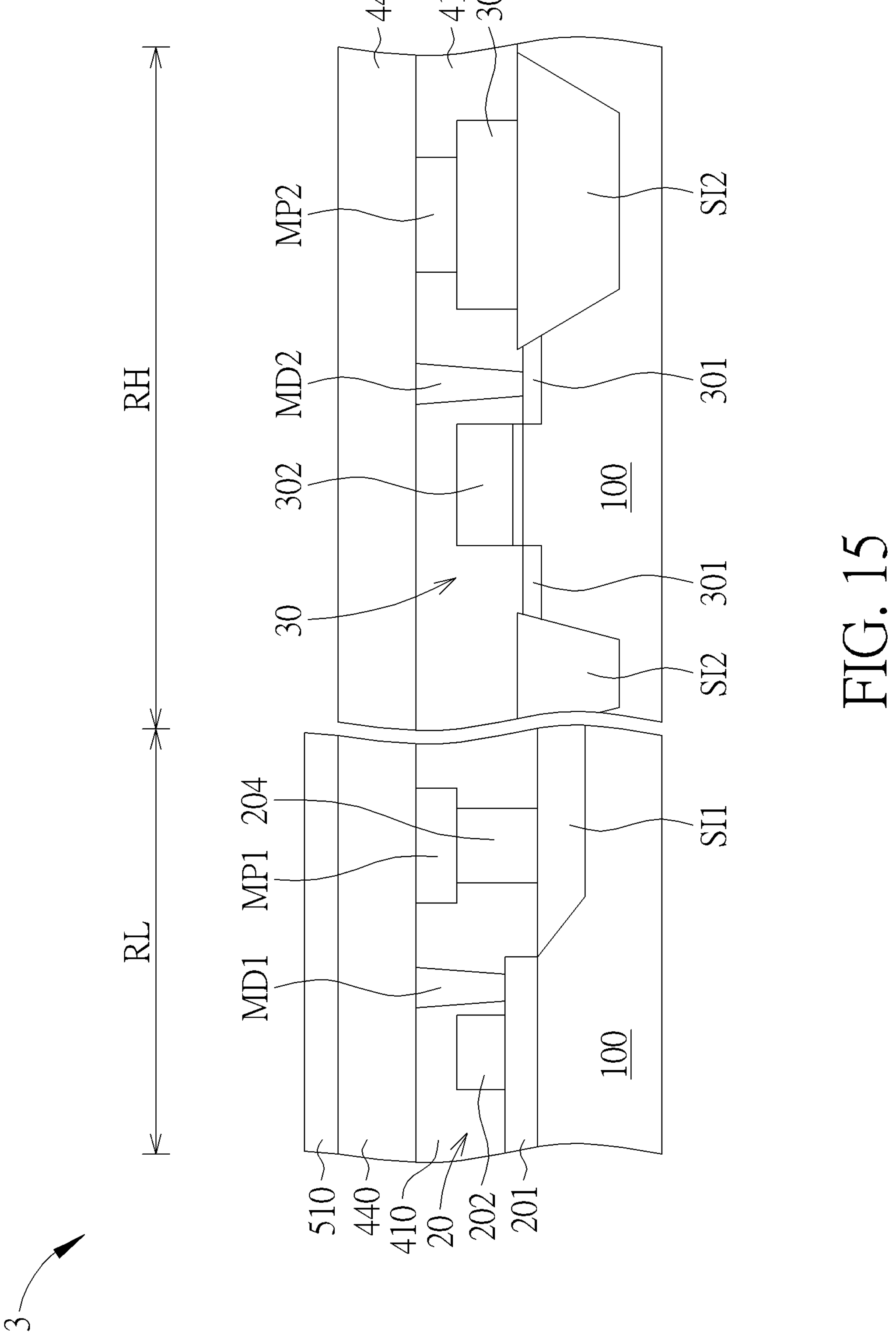
FIGS. 15-18 illustrate a method of forming an eHV semiconductor device according to still another embodiment of the present invention.

As shown in FIG. 15, a substrate 100 is provided, for example, a silicon substrate, but is not limited thereto. According to an embodiment of the present invention, the substrate 100 has a low-voltage device region RL and a high-voltage device region RH. A trench isolation region SI1 and a trench isolation region SI2 are respectively formed in the substrate 100 in the low-voltage device region RL and the high-voltage device region RH. The trench isolation region SI1 and the trench isolation region SI2 can be formed using a shallow trench insulation (STI) process.

According to an embodiment of the present invention, in the low-voltage device region RL, a circuit element 20 is formed on the substrate 100 adjacent to the trench isolation region SI1. In the high-voltage device region RH, a circuit element 30 is formed on the substrate 100 adjacent to the trench isolation region SI2. According to an embodiment of the present invention, for example, the circuit element 20 may be a FinFET device, but is not limited thereto. According to an embodiment of the present invention, the operating voltage of the circuit element 20 may be less than 5V, for example, 1.8V. The circuit element 20 may include a fin structure 201 and a metal gate 202 extending across the fin structure 201. According to an embodiment of the present invention, for example, the circuit element 30 may be a high-voltage transistor element with operating voltages greater than 5V. For example, the circuit element 20 may be a planar field effect transistor including a drain or source doped region 301 and a gate 302.

According to an embodiment of the present invention, a gate 204 and a gate 304 are formed on the trench isolation region SI1 and the trench isolation region SI2, respectively. According to an embodiment of the present invention, for example, the gate 204 and the gate 304 may be metal gates, but are not limited thereto.

Subsequently, a chemical vapor deposition process may be performed to deposit an interlayer dielectric (ILD) layer 410 on the substrate 100 in a blanket manner. A metallization process is then performed to form a diffusion contact MD1 and a gate contact MP1 in the ILD layer 410 in the low-voltage device region RL, and a diffusion contact MD2 and a gate contact MP2 in the ILD layer in the high-voltage device region RH. According to an embodiment of the present invention, the diffusion contact MD1 directly contacts the doped region on the fin structure 201, the gate contact MP1 directly contacts the gate 204, the diffusion contact MD2 directly contacts the drain or source doped region 301, and the gate contact MP2 directly contacts the gate 304. According to an embodiment of the present invention, the gate 204 and the gate contact MP1 are located directly above the trench isolation region SI1, and the gate 304 and the gate contact MP2 are located directly above the trench isolation region SI2. According to an embodiment of the present invention, the gate contact MP1 and the gate contact MP2 may contain tungsten, but are not limited thereto.

Subsequently, a chemical vapor deposition process may be performed to deposit an inter-metal dielectric (IMD) layer 440 on the substrate 100 in a blanket manner. According to an embodiment of the present invention, for example, the IMD layer 440 may include UV-curable low-k or ultra-low-k dielectric materials. For example, the IMD layer 440 may include porous silicon dioxide, porous carbon-doped silicon dioxide, porous SiLK, porous SiCOH layers, or the like. A mask layer 510 is formed on the IMD layer 440 in the low-voltage device region RL. For example, the mask layer 510 may include silicon oxynitride, but is not limited thereto. At this point, the IMD layer 440 in the high-voltage device region RH is not covered by the mask layer 510, and is exposed.

Figure 16:
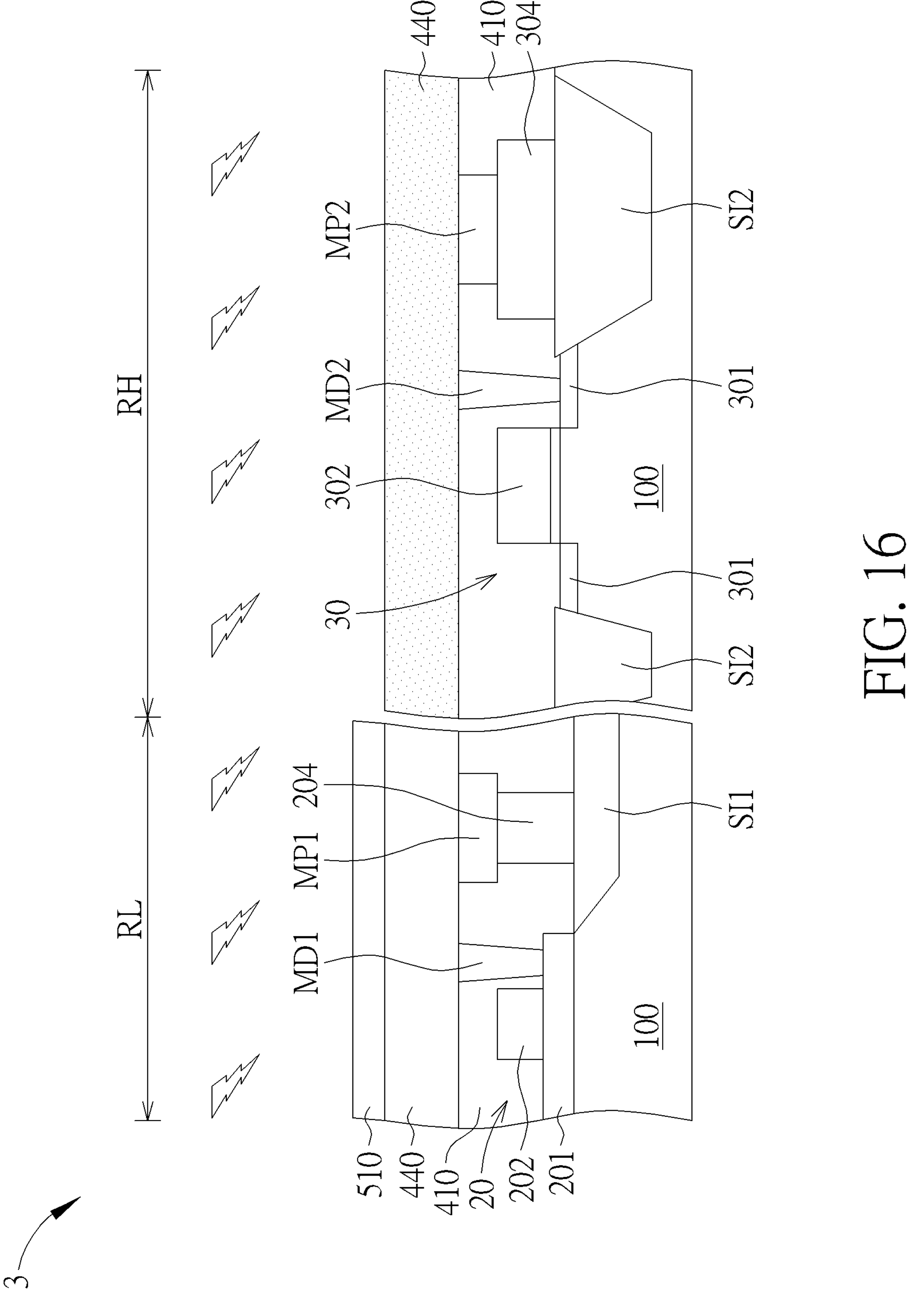

As shown in FIG. 16, a UV curing process is performed so that the IMD layer 440 in the high-voltage device region RH is directly irradiated with ultraviolet light to form a densified IMD layer **440*d*. According to an embodiment of the present invention, the IMD layer 440 and the IMD layer 440*d* are both ultra-low dielectric constant material layers. According to an embodiment of the present invention, for example, the IMD layer 440 in the high-voltage device region RH is irradiated with ultraviolet light for about 300 seconds, which may increase the hardness of the IMD layer 440 in the high-voltage device region RH from about 0.75 GPa to about 1-2 GPa, thereby forming the densified IMD layer 440*d***.

Figure 17:
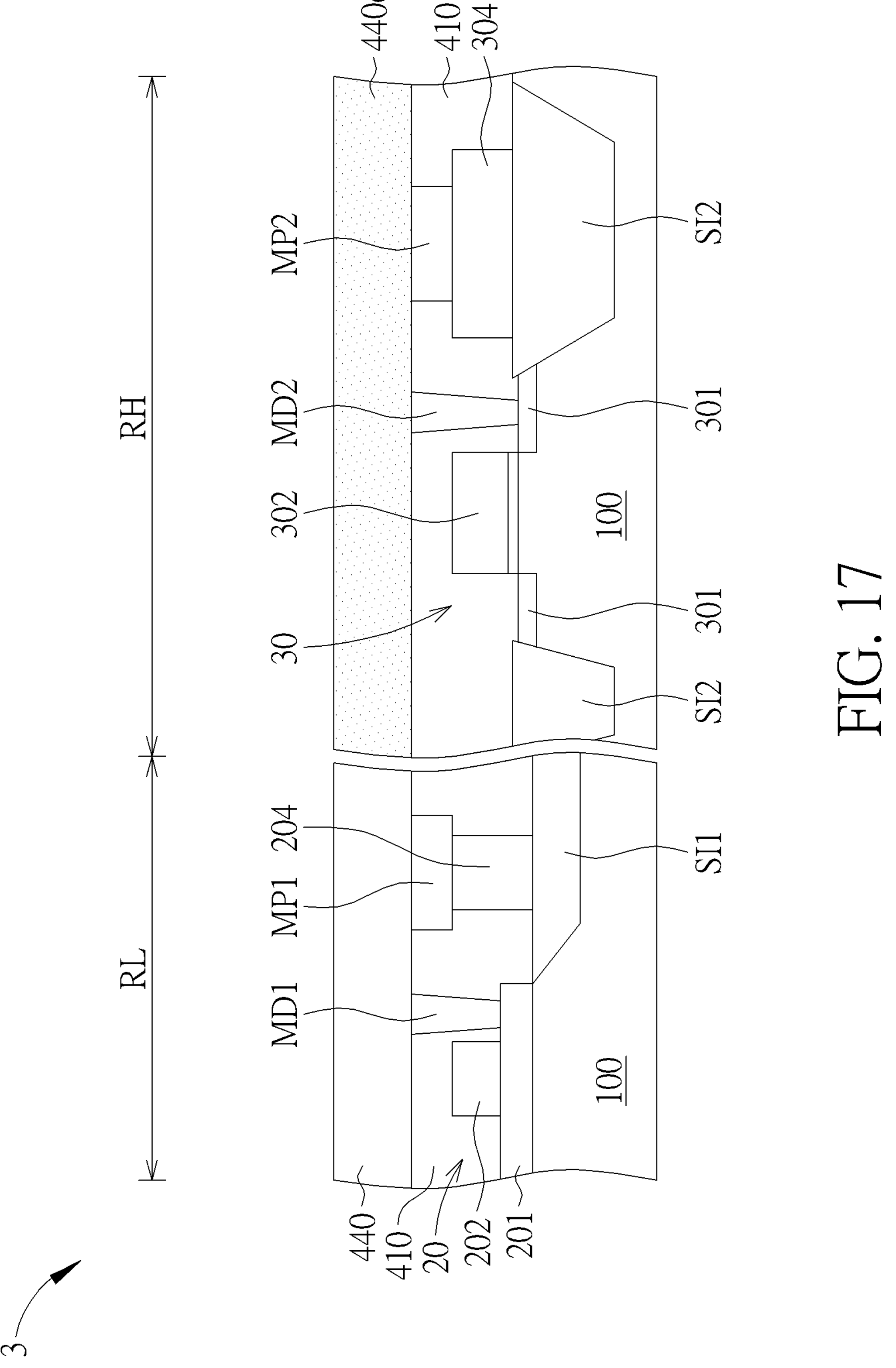

As shown in FIG. 17, after the UV curing process is completed, an etching process, such as a wet etching process, is performed to remove the mask layer 510 so as to expose the IMD layer 440 in the low-voltage device region RL.

Figure 18:
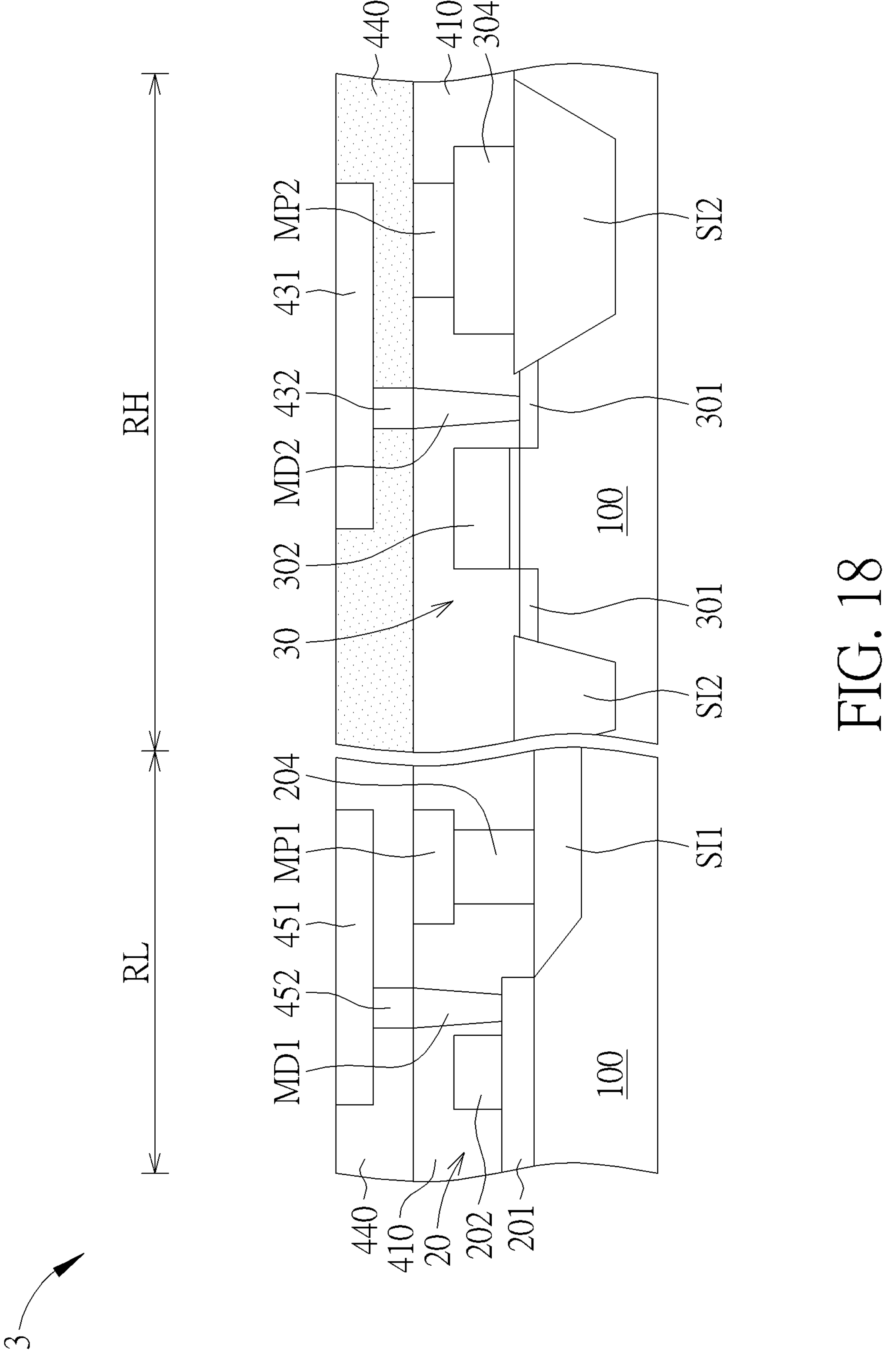

As shown in FIG. 18, a metallization process, such as a damascene copper process is then performed, to form an interconnection metal layer 431 and a via 432 in the IMD layer **440*d* in the high-voltage device region RH, and an interconnection metal layer 451 and a via 452 in the IMD 440** in the low-voltage device region RL.

According to an embodiment of the present invention, the interconnection metal layer 431 extends laterally to the region directly above the gate 304 and the gate contact MP2. When viewed from above, the interconnection metal layer 431 overlaps the gate contact MP2. Between the interconnection metal layer 431 and the gate contact MP2 is the IMD layer **440*d*. According to an embodiment of the present invention, the interconnection metal layer 451 extends laterally to the region directly above the gate 204 and the gate contact MP1. When viewed from above, the interconnection metal layer 451 overlaps the gate contact MP1. Between the interconnection metal layer 451 and the gate contact MP1 is the IMD layer 440**.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An embedded high-voltage (eHV) semiconductor device, comprising:

a substrate having a low-voltage device region and a high-voltage device region thereon;

an inter-layer dielectric (ILD) layer on the substrate;

a first trench isolation region in the substrate within the low-voltage device region;

a first gate in the ILD layer and on the first trench isolation region;

a first gate contact in the ILD layer and on the first gate;

a first interconnection metal layer overlying the first gate contact;

a first inter-metal dielectric (IMD) layer on the ILD layer and between the first interconnection metal layer and the first gate contact;

a second trench isolation region in the substrate within the high-voltage device region;

a second gate in the ILD layer and on the second trench isolation region;

a second gate contact in the ILD layer and on the second gate;

a second interconnection metal layer overlying the second gate contact; and a second inter-metal dielectric (IMD) layer on the ILD layer and between the second interconnection metal layer and the second gate contact, wherein the second IMD layer is denser than the first IMD layer.

2. The eHV semiconductor device according to claim 1, wherein the second interconnection metal layer overlaps the second gate contact.

3. The eHV semiconductor device according to claim 1, wherein the first IMD layer comprises an ultra-low dielectric constant material layer.

4. The eHV semiconductor device according to claim 3, wherein the second IMD layer comprises a TEOS-based oxide layer or a high-density plasma (HDP) oxide layer.

5. The eHV semiconductor device according to claim 4, wherein the second interconnection metal layer is disposed in the second IMD layer.

6. The eHV semiconductor device according to claim 4, wherein the first IMD layer extends onto a top surface of the second IMD layer.

7. The eHV semiconductor device according to claim 6, wherein the second interconnection metal layer is disposed in the first IMD layer that extends onto the top surface of the second IMD layer.

8. The eHV semiconductor device according to claim 1, wherein the first gate contact and the second gate contact comprise tungsten.

9. The eHV semiconductor device according to claim 1, wherein the first gate and the second gate are metal gates.

10. The eHV semiconductor device according to claim 1, wherein the first IMD layer and the second IMD layer are ultra-low dielectric constant material layer.

11. A method for forming an embedded high-voltage (eHV) semiconductor device, comprising:

providing a substrate having a low-voltage device region and a high-voltage device region thereon;

forming an inter-layer dielectric (ILD) layer on the substrate;

forming a first trench isolation region in the substrate within the low-voltage device region;

forming a first gate disposed in the ILD layer and on the first trench isolation region;

forming a first gate contact in the ILD layer and on the first gate;

forming a first interconnection metal layer overlying the first gate contact;

forming a first inter-metal dielectric (IMD) layer on the ILD layer and between the first interconnection metal layer and the first gate contact;

forming a second trench isolation region in the substrate within the high-voltage device region;

forming a second gate in the ILD layer and on the second trench isolation region;

forming a second gate contact in the ILD layer and on the second gate;

forming a second interconnection metal layer overlying the second gate contact; and forming a second inter-metal dielectric (IMD) layer on the ILD layer and between the second interconnection metal layer and the second gate contact, wherein the second IMD layer is denser than the first IMD layer.

12. The method according to claim 11, wherein the second interconnection metal layer overlaps the second gate contact.

13. The method according to claim 11, wherein the first IMD layer comprises an ultra-low dielectric constant material layer.

14. The method according to claim 13, wherein the second IMD layer comprises a TEOS-based oxide layer or a high-density plasma (HDP) oxide layer.

15. The method according to claim 14, wherein the second interconnection metal layer is disposed in the second IMD layer.

16. The method according to claim 14, wherein the first IMD layer extends onto a top surface of the second IMD layer.

17. The method according to claim 16, wherein the second interconnection metal layer is disposed in the first IMD layer that extends onto the top surface of the second IMD layer.

18. The method according to claim 11, wherein the first gate contact and the second gate contact comprise tungsten.

19. The method according to claim 11, wherein the first gate and the second gate are metal gates.

20. The method according to claim 11, wherein the first IMD layer and the second IMD layer are ultra-low dielectric constant material layer.

* * * * *